(12) United States Patent
Lai

(10) Patent No.: US 9,560,747 B2
(45) Date of Patent: Jan. 31, 2017

(54) PHOTOELECTRIC CONVERTING MODULE AND METHOD FOR ASSEMBLING SAME WITH CURABLE ADHESIVE

(71) Applicant: HON HAI PRECISION INDUSTRY CO., LTD., New Taipei (TW)

(72) Inventor: Chih-Chen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 131 days.

(21) Appl. No.: 14/585,385

(22) Filed: Dec. 30, 2014

(65) Prior Publication Data

US 2015/0185070 A1    Jul. 2, 2015

(30) Foreign Application Priority Data

Dec. 31, 2013    (TW) .............. 102149398 A

(51) Int. Cl.
*H01J 5/02*        (2006.01)
*H05K 1/02*        (2006.01)
*G01J 1/02*        (2006.01)
*H05K 3/30*        (2006.01)
*H01L 31/167*      (2006.01)

(52) U.S. Cl.
CPC ........... *H05K 1/0274* (2013.01); *G01J 1/0252* (2013.01); *G01J 1/0271* (2013.01); *H01L 31/167* (2013.01); *H05K 1/0212* (2013.01); *H05K 3/305* (2013.01); *H05K 2201/10121* (2013.01); *Y10T 156/10* (2015.01)

(58) Field of Classification Search
CPC ..... Y10T 156/10; G01J 1/0252; G01J 1/0271; H01L 31/167; H01L 27/14625; H01L 31/0203; H01L 31/173; H05K 3/305; H05K 1/0212; H05K 2201/10121; H05K 1/0274
USPC ........ 250/239, 216, 214 R, 551; 438/26, 27; 257/99, 434, 433, 432, 448, 466, 82, 81
See application file for complete search history.

(56) References Cited

U.S. PATENT DOCUMENTS

| | | | | |
|---|---|---|---|---|
| 7,150,569 B2* | 12/2006 | Oono | ................... | G02B 6/4206 156/89.11 |
| 7,898,085 B2* | 3/2011 | Fujimori | ............... | H01L 23/481 257/433 |
| 2009/0208167 A1* | 8/2009 | Hodono | ................... | G02B 6/10 385/14 |

* cited by examiner

*Primary Examiner* — Que T Le
*Assistant Examiner* — Jennifer Bennett
(74) *Attorney, Agent, or Firm* — Zhigang Ma

(57) ABSTRACT

A photoelectric converting module includes a circuit board and an optical coupling member. The circuit board includes a substrate defining a plurality of heat-conducting through holes and a hot-curable adhesive layer covering the heat-conducting through holes. The optical coupling member is fixed to the substrate via the hot-curable adhesive layer.

4 Claims, 6 Drawing Sheets

PHOTOELECTRIC CONVERTING MODULE AND METHOD FOR ASSEMBLING SAME WITH CURABLE ADHESIVE

FIELD

The subject matter herein generally relates to optical communicating technology, particularly to a photoelectric converting module and a method for assembling the photoelectric converting module.

BACKGROUND

A photoelectric converting module usually includes a circuit board and an optical coupler. Curable glue is usually used to fix the optical coupler to the circuit board. During curing, the curable glue may flow as a result the optical coupler can move relative to the circuit board. Therefore, the optical coupler cannot be precisely fixed on the circuit board.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
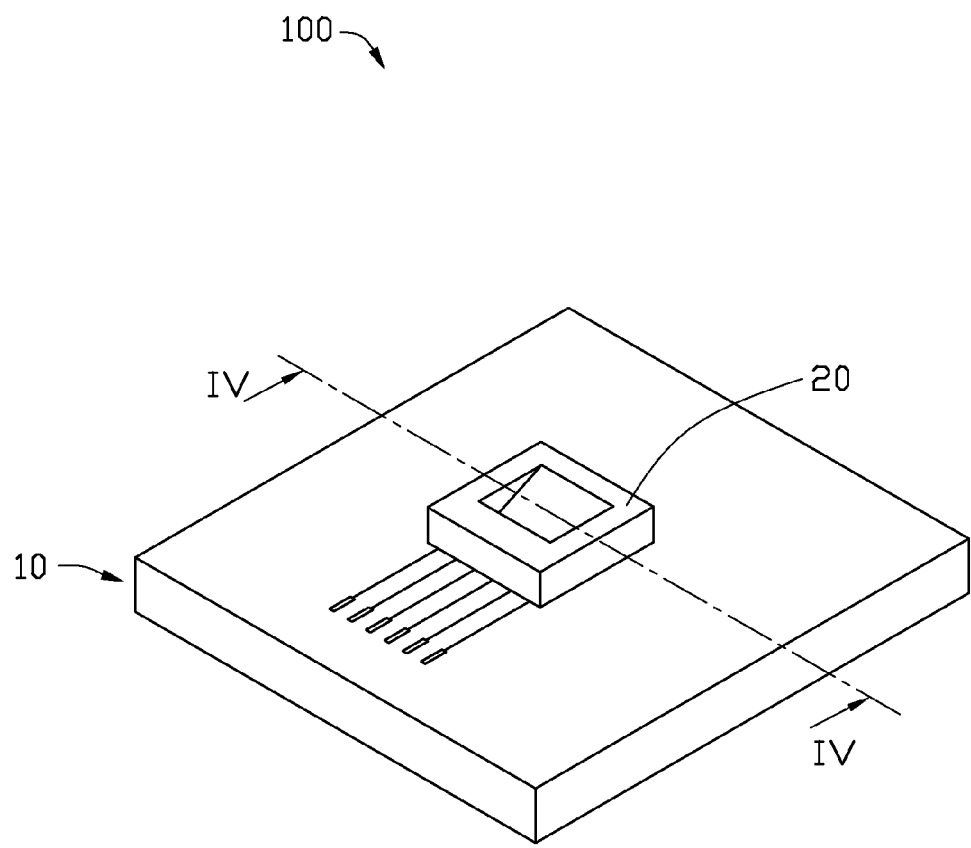
FIG. 1 is an isometric view of a photoelectric converting module according to an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

The present disclosure is described in relation to a light emitting device and a backlight module including the light emitting device.

FIG. 1 illustrates that a photoelectric converting module 100 can include a circuit board 10 and an optical coupler 20.

Figure 2:
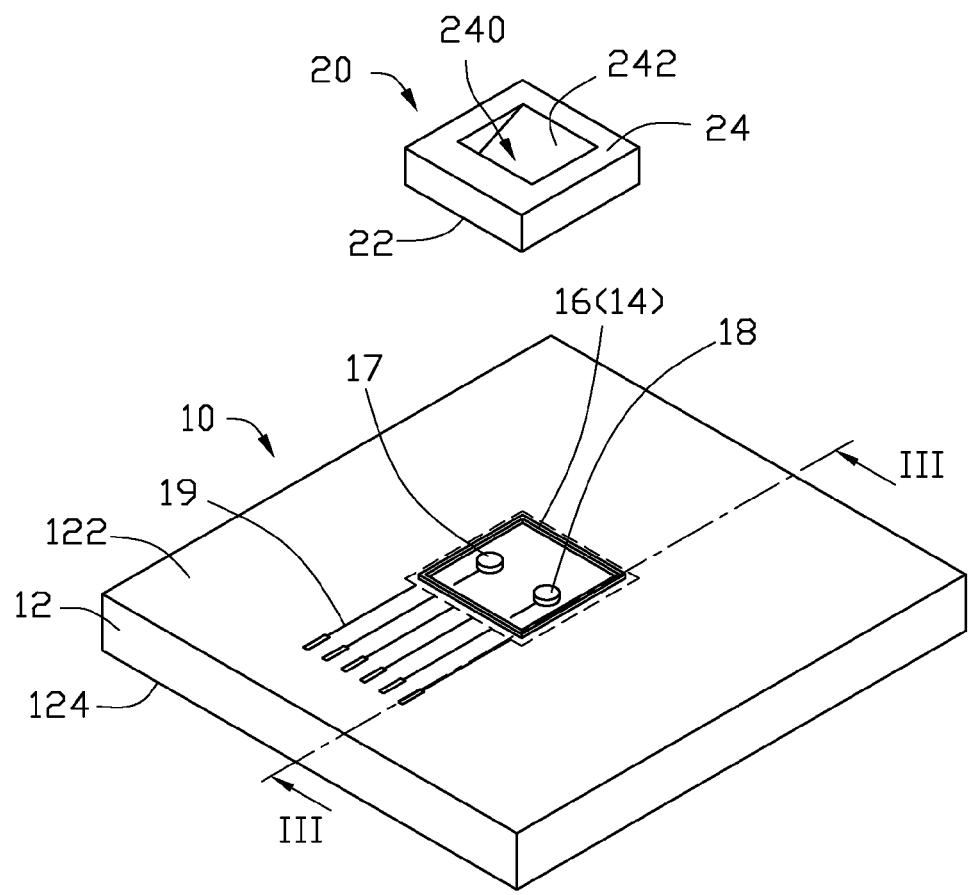
FIG. 2 is an exploded view of the photoelectric converting module of FIG. 1.
Figure 3:
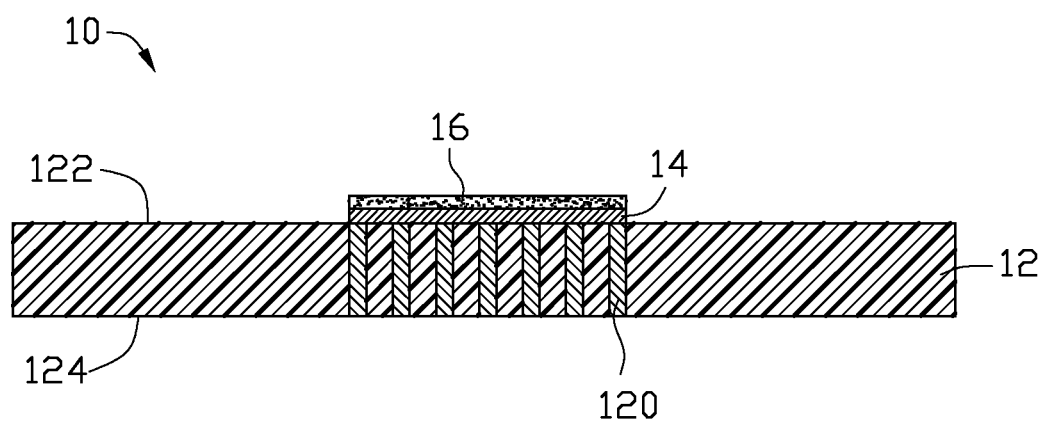
FIG. 3 is a cross sectional view taking along III-III line of FIG. 2.

FIGS. 2 and 3 illustrate that the circuit board 10 can include a substrate 12, a metal heat-conducting layer 14, a hot-curable adhesive layer 16, a light emitting device 17, a light receiving device 18, and a plurality of traces 19.

The substrate 12 includes a first surface 122 and a second surface 124 opposite to the first surface 122. The first and second surfaces 122, 124 are parallel to each other. The substrate 12 defines a plurality of heat-conducting through holes 120 extending from the first surface 122 through the second surface 124. The heat-conducting through holes 120 are filled with metal. In this embodiment, the heat-conducting through holes 120 are arranged along a peripheral of an imaginary rectangular frame.

The metal heat-conducting layer 14 is a rectangular frame, formed on the first surface 122 and connected with the heat-conducting through holes 120. That is, the metal heat-conducting layer 14 is connected with the metal filled in the heat-conducting through holes 120. In this embodiment, the metal heat-conducting layer 14 and the metal filled in the heat-conducting through hole 120 are made of same material, such as copper or aluminum.

The hot-curable adhesive layer 16 is applied to the metal heat-conducting layer 14.

The light emitting device 17, the light receiving device 18 and the traces 19 are positioned on the first surface 122. The light emitting device 17 emits light and the light receiving device 18 receives light. In this embodiment, the light emitting device 17 is a laser source, and the light receiving device 18 is a photodiode. The light emitting device 17 and the light receiving device 18 are electrically connected to corresponding traces 19. The light emitting device 17, the light receiving device 18 and the traces 19 are electrically isolated from the metal heat-conducting layer 14 and the hot-conducting holes 120. In this embodiment, the light emitting device 17 and the light receiving device 18 are surrounded by the metal heat-conducting layer 14, and are connected to the traces 19 via conductive holes (not shown).

Figure 4:
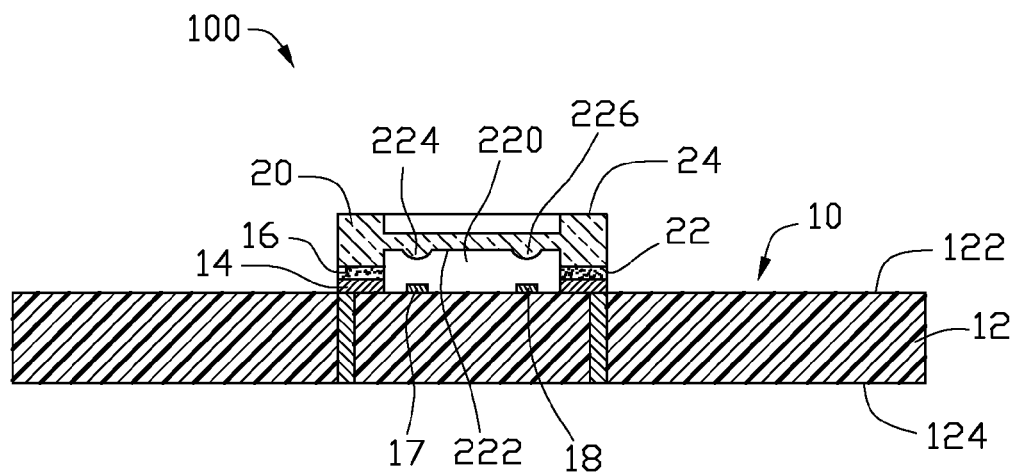
FIG. 4 is a cross sectional view taking along IV-IV line of FIG. 1.

FIGS. 2 and 4 illustrate the optical coupler 20 including a bottom surface 22 and a top surface 24 opposite to the bottom surface 22. The bottom surface 22 is adjacent to the substrate 12. The bottom surface 22 defines a bottom groove 220. The bottom groove 220 includes an optical surface 222 parallel to the bottom surface 22. The top surface 24 defines a top groove 240 aligned with the bottom surface 22. The top groove 240 includes a reflective surface 242 tilted about 45 degrees relative to the bottom surface 22. The bottom surface 22 is connected to the first surface 122 via the hot-curable adhesive layer 16. The optical coupler 20 further includes a first optical lens 224 and a second optical lens 226 formed on the optical surface 222. The first optical lens 224 is aligned with the light emitting device 17. The second optical lens 226 is aligned with the light receiving device 18.

In other embodiments, there is no metal heat-conducting layer 14 and the hot-curable adhesive layer 16 can be directly applied on the first surface 122 and cover the heat-conducting through holes 120.

Figure 5:
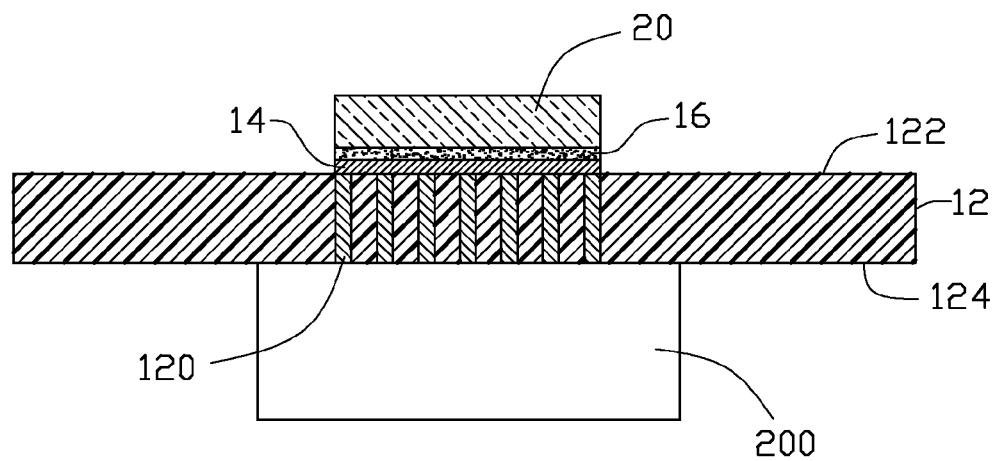
FIG. 5 is a cross sectional view showing the photoelectric converting module of FIG. 1 being heated by a heating device.
Figure 6:
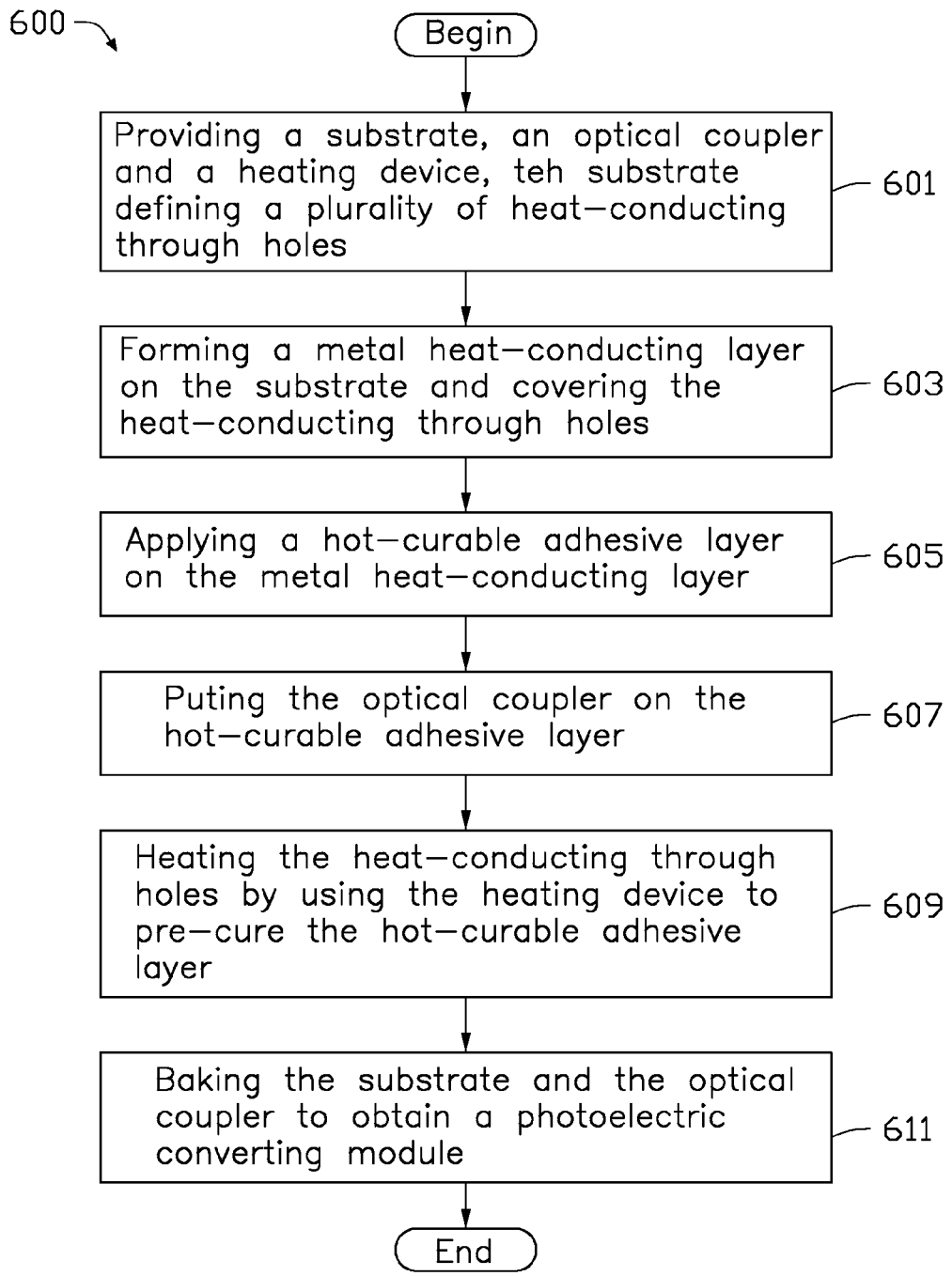
FIG. 6 is a flowchart showing an assembling process of the photoelectric converting module of FIG. 1.

Referring to FIG. 6, a flowchart is presented in accordance with an example embodiment which is being thus illustrated. The example method 600 is provided by way of example, as there are a variety of ways to carry out the method. The method 600 described below can be carried out using the configurations illustrated in FIGS. 1-5, for example, and various elements of these figures are referenced in explaining example method 600. Each block shown in FIG. 6 represents one or more processes, methods or subroutines, carried out in the exemplary method 600. Additionally, the illustrated order of blocks is by example only and the order of the blocks can change according to the present disclosure. The exemplary method 600 can begin at block 601.

At block 601, as shown in FIG. 5, the substrate 12, the optical coupler 20 and a heating device 200 is provided. The substrate 12 is put on the heating device 200. In this embodiment, the heating device 200 is a pulse heating device.

At block 603, the metal heat-conducting layer 14 is formed on the substrate 12 and covers the heat-conducting through holes 120.

At block 605, hot-curable adhesive glue is applied on the first surface 122 to form the hot-curable adhesive layer 16 covering the metal heat-conducting layer 14.

At block 607, the optical coupling lens 20 is put on the hot-curable adhesive layer 16, the first optical lens 224 is aligned with the light emitting device 17, and the second optical lens 226 is aligned with the light receiving device 18.

At block 609, the heating device 200 heats the substrate 12 to pre-cure the hot-curable adhesive layer 16. In this embodiment, heat is transmitted to the hot-curable adhesive layer 16 rapidly and evenly through the heat-conducting through holes 120 and the metal heat-conducting layer 14.

At block 611, the substrate 12 and the optical coupler 20 are baked to fully cure the heat-curable adhesive layer 16, and the photoelectric converting module 100 is obtained.

The hot-curable adhesive layer 16 can be pre-cured by using the heating device 200 and the heat-conducting through holes 120. Thus, the hot-curable adhesive layer 16 will not flow during the process of baking and the optical coupler 20 can be precisely fixed to the circuit board 10.

It will be understood that the above particular embodiments are shown and described by way of illustration only. The principles and the features of the present disclosure can be employed in various and numerous embodiments thereof without departing from the scope of the disclosure. The above-described embodiments illustrate the scope of the disclosure but do not restrict the scope of the disclosure.

What is claimed is:

1. A photoelectric converting module comprising:
    a circuit board comprising:
        a substrate defining a plurality of heat-conducting through holes; and
        a hot-curable adhesive layer covering the heat-conducting through holes; and
    an optical coupler fixed to the substrate via the hot-curable adhesive layer;
    wherein the circuit board further comprises a metal heat-conducting layer positioned between the hot-curable adhesive layer and the substrate and covering the heat-conducting through holes;
    wherein the heat-conducting through holes are arranged along edges of an imaginary frame, and the hot-curable adhesive layer and the metal heat-conducting layer are arranged within the imaginary frame; and
    wherein the circuit board further comprises a plurality of traces, a light emitting device, and a light receiving device, the light emitting device and the light receiving device are surrounded by the metal heat-conducting layer, and the traces, the light emitting device and the light receiving device are electrically isolated from the metal heat-conducting layer and the heat-conducting through hole.

2. The photoelectric converting module of claim 1, wherein the optical coupler comprises a first optical lens aligned with the light emitting device, and a second optical lens aligned with the light receiving device.

3. A method for assembling a photoelectric converting module comprising a circuit board, the method comprising:
    providing a substrate defining a plurality of heat-conducting through holes, an optical coupler, and a heating device;
    applying a hot-curable adhesive layer covering the heat-conducting through holes;
    putting the optical coupler on the hot-curable adhesive layer;
    heating the heat-conducting through holes by using the heating device to pre-cure the hot-curable adhesive layer; and
    baking the substrate and the optical coupler to obtain the photoelectric converting module;
    wherein the circuit board further comprises a metal heat-conducting layer positioned between the hot-curable adhesive layer and the substrate and covering the heat-conducting through holes;
    wherein the heat-conducting through holes are arranged along edges of an imaginary frame, and the hot-curable adhesive layer and the metal heat-conducting layer are arranged within the imaginary frame; and
    wherein the circuit board further comprises a plurality of traces, a light emitting device, and a light receiving device, the light emitting device and the light receiving device are surrounded by the metal heat-conducting layer, and the traces, the light emitting device and the light receiving device are electrically isolated from the metal heat-conducting layer and the heat-conducting through hole.

4. The method of claim 3, wherein the optical coupler comprises a first optical lens aligned with the light emitting device, and a second optical lens aligned with the light receiving device.

* * * * *